United States Patent [19]

Lee

[11] Patent Number: 5,047,731

[45] Date of Patent: Sep. 10, 1991

[54] VARIABLE GAIN WIDEBAND BIPOLAR MONOLITHIC AMPLIFIER

[75] Inventor: Donald M. Lee, San Jose, Calif.

[73] Assignee: Hewlett-Packard Company, Palo Alto, Calif.

[21] Appl. No.: 577,873

[22] Filed: Sep. 5, 1990

[51] Int. Cl.[5] ............................................. H03G 3/12
[52] U.S. Cl. .................................... 330/282; 330/307
[58] Field of Search ................ 330/51, 129, 131, 278, 330/282, 293, 296, 300, 310

[56] References Cited

U.S. PATENT DOCUMENTS 2,951,991  9/1960  Rickner et al. ..................... 330/282

FOREIGN PATENT DOCUMENTS 1239838  6/1986  U.S.S.R. .............................. 330/282

Primary Examiner—Steven Mottola

[57] ABSTRACT

A variable gain wideband bipolar monolithic amplifier has first and second bipolar transistors connected together in a Darlington configuration. A resistive shunt feedback loop connected between the output and the input of the amplifier controls the gain of the amplifier. The feedback loop includes a field effect transistor, formed on the same chip substantially by the same bipolar process as the bipolar transistors, for varying the impedance of the shunt feedback loop thereby varying the gain of the amplifier. The gain of the amplifier is controlled in response to the application of a control voltage to the gate of the FET. Further, the FET is dc biased for inhibiting the FET from drawing dc current.

20 Claims, 2 Drawing Sheets

VARIABLE GAIN WIDEBAND BIPOLAR MONOLITHIC AMPLIFIER

FIELD OF THE INVENTION

This invention relates generally to bipolar transistor circuits, and more particularly, to a bipolar monolithic variable gain amplifier.

BACKGROUND OF THE INVENTION

Monolithic devices have evolved quickly over their history. For example, silicon integrated circuits have grown from small scale integration (SSI) to large scale and very large scale integration (LSI and VLSI) to the current standard of ultra large scale integration (ULSI). The reason for the intense growth is the desire to implement more and more circuitry into a smaller and smaller area.

While development of integrated circuits took off, some monolithic circuit capabilities have been practically ignored. Case in point; the monolithic bipolar transistor circuit built from a discrete bipolar process. In the beginning, when solid state transistors were first manufactured, the transistors were made according to a discrete bipolar process. In this process, the wafer substrate comprised the collectors of each transistor formed on the wafer, and therefore, the transistors were not isolated from each other. If a multi-transistor circuit was to be manufactured on a single silicon wafer, the circuit designer would have to deal with the difficult design constraint of having all of the transistor collectors connected together. Thus, bipolar transistors were typically sold individually by dicing the wafer and housing each transistor in separate packages. The circuit designer would then interconnect these discrete components, along with other traditional circuit components, such as resistors, capacitors and inductors, to form multi-transistor circuits.

The demand, however, was to have multiple transistors in a single package to aid in the miniaturization of electrical devices and components. It is from this demand that today's integrated circuit industry emerged. The development of new processes allowed for the design of the metal oxide semiconductor and the CMOS chip. The CMOS technology allowed more transistors to be implemented in small chips without heat dissipation problems. As a result, the nature of circuit design changed. Inductors could not be realized on the chips, capacitors could be built, but were often avoided because their inclusion increased the cost of the chip (their size made the chip too big or their inclusion degraded manufacturing yields). Thus, circuit design evolved into a heavy utilization of transistors, thereby increasing the need to implement more transistors on a single chip.

Discrete bipolar transistor technology was not killed by the integrated circuit however. The isolation techniques required to built an integrated circuit added a substantial amount of parasitic capacitance to the transistor. This resulted in a reduction of bandwidth which was substantial enough to make integrated circuits inappropriate for microwave use. The reduction in operating speed was something that integrated circuit designers willingly accepted in exchange for the high transistor density of the integrated circuit. Microwave circuit designers, on the other hand, remained dependent upon the discrete bipolar transistor because of its ability to operate at extremely high frequencies.

Without the isolation process used in integrated circuits, multi-transistor circuit design is virtually impossible since all transistor collectors are connected together. One particular circuit configuration, however, is currently commercially available in an integrated bipolar transistor circuit. Namely, a Darlington integrated transistor pair has been achieved. The Darlington pair consists of a pair of transistors having their collectors connected together and the emitter of the first transistor is connected to the base of the second transistor. The emitter of the second transistor, the base of the first transistor and the common collector are available externally for connection.

The Darlington configuration is useful as either a very high gain amplifier, with $h_{fe}$ as high as 30,000, or as a high input impedance amplifier with approximately unity gain. The problem remains, however, that external components must be added to the circuit to bias the transistors. Further, the types of components that can be integrated are severely limited to bipolar transistors (with common collectors) and small resistors.

SUMMARY OF THE INVENTION

The present invention provides an amplifier circuit integrated on a single semiconductor chip. The transistors on the chip are formed by a bipolar process which does not include an isolation process to isolate the transistor components. The resulting circuit is a monolithic bipolar variable gain amplifier. First and second bipolar transistors are connected together in a Darlington configuration having an input and an output. The gain of the amplifier is controlled through a resistive shunt feedback loop connected between the output and the input. The feedback loop includes means for varying the impedance of the shunt feedback loop, thereby varying the gain of the amplifier.

The means for varying the impedance of the shunt feedback loop comprises a field effect transistor (FET) connected in series with the shunt feedback loop. The FET is formed by a modified bipolar process on the chip wherein the base implant of the bipolar resistors is omitted. The gain of the amplifier is controlled in response to the application of a control voltage to the gate of the FET. Further, the FET is dc biased to inhibit the FET from drawing dc current.

Because of the discrete bipolar process used t manufacture the circuit, the collectors of each bipolar transistor and the source of the field effect transistor are electrically connected together. Despite this constraint, the circuit provides a variable gain amplifier suitable for use at microwave frequencies. Further, the input and output are impedance matched for use in transmission line applications.

BRIEF DESCRIPTION OF THE DRAWINGS

The features of a specific embodiment of the best mode contemplated for carrying out the invention are illustrated in the drawing, in which.

DETAILED DESCRIPTION

Figure 1:
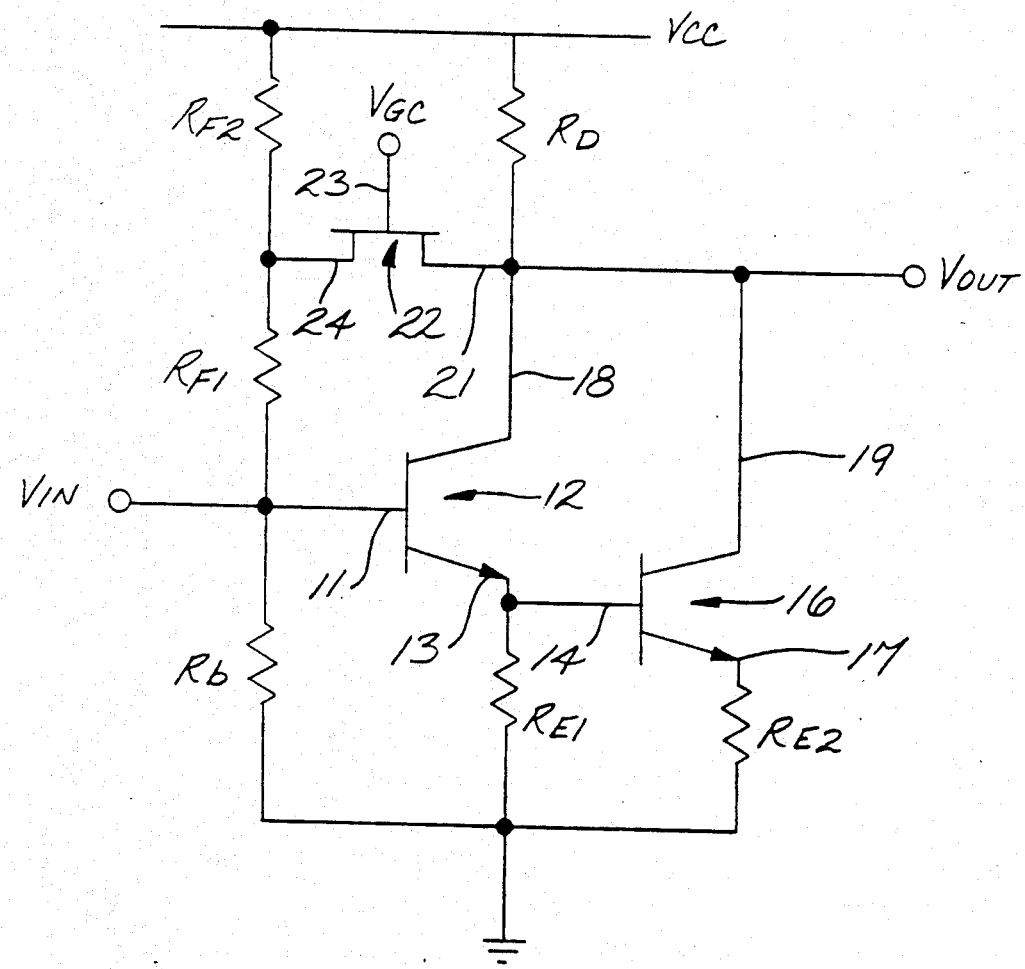
FIG. 1 is a schematic of the variable gain wideband bipolar monolithic amplifier circuit.

Referring initially to FIG. 1, the circuit of the present invention comprises, in part, a pair of bipolar transistors connected in a monolithic Darlington configuration. The base 11 of a first bipolar transistor 12 is connected to an input signal $V_{IN}$. The emitter 13 of the first transistor is connected to the base 14 of a second bipolar transistor 16. The base 11 of the first bipolar transistor is connected to ground via a base resistor $R_S$. Similarly, the emitter 13 of the first bipolar transistor 12 and the emitter 17 of the second bipolar transistor 16 are connected to ground via a first emitter resistor $R_{E1}$ and a second emitter resistor $R_{E2}$ respectively.

In an exemplary embodiment, the base resistor has a value of 100 ohms and the first emitter resistor has a value of 80 ohms. The second emitter resistor $R_{E2}$ is very small and can have a value as small as zero ohms (thus shorting the emitter 17 of the second bipolar transistor to ground.)

The collector 18 of the first bipolar transistor and the collector 19 of the second bipolar transistor are connected together to provide the output $V_{OUT}$ of the circuit. The collectors 18 and 19 of the bipolar transistors are also connected to the source 21 of a field effect transistor (FET) 22. The FET has a gate 23 which is connected to a control voltage $V_{GC}$ and a drain 24 which is connected to the base 11 of the first bipolar transistor via a first feedback resistor $R_{F1}$.

The FET 22 provides a variable impedance element in the shunt feedback loop of the amplifier, the impedance of which depends on the control voltage $V_{GC}$ applied to the gate 23 of the FET. For example, when the control voltage is relatively low, the conductance of the FET is low which results in a relatively high amplifier gain. Conversely, when the control voltage is relatively high, the conductance of the FET is high which results in a relatively low amplifier gain.

The circuit also has a drop-down resistor $R_D$ connected between the source 21 of the FET and a supply voltage $V_{CC}$ and a second feedback resistor $R_{F2}$ connected between the drain 24 of the FET and the supply voltage. The drop-down resistor is used to bias the first and second transistors. As in other transistor circuits, the bipolar transistors are dc biased to adjust the quiescent point (or quiescent current) of the transistors thus allowing the circuit to operate on a small-signal ac input. In an exemplary embodiment of the present invention, the drop-down resistor is selected to be approximately 350 ohms.

The second feedback resistor $R_{F2}$ is necessary to properly bias the FET. The second feedback resistor and the first feedback resistor together form a resistive voltage divider between the base 11 of the first bipolar transistor and the supply voltage. The center tap of the voltage divider is connected to the drain 24 of the FET. By adjusting the values of the feedback resistors, the dc bias voltage at the drain 24 of the FET can be selected. This is an important feature since it is desirable for the source and the drain of the FET to remain at approximately the same voltage potential. By keeping the source and drain at approximately equal voltages, the FET is balanced and it does not draw an appreciable amount of dc current. This ensures that the bipolar transistors will be properly biased regardless of the conductivity of the FET. On the other hand, if the FET is not balanced, it will draw dc current in proportion to its conductivity. Accordingly, when the conductivity of the unbalanced FET is modulated through the application of the control voltage $V_{GC}$, the dc bias of the amplifier will change thus causing quiescent current at which the transistors are operating at to change accordingly.

In an exemplary embodiment, the first feedback resistor $R_{F1}$ is selected to be approximately 70 ohms and the second feedback resistor $R_{F2}$ is selected to be 550 ohms. This will ensure that the potentials of the source 24 and drain 21 of the FET 22 will be approximately the same, measured from the supply voltage, regardless of the conductivity of the FET.

Figure 2:
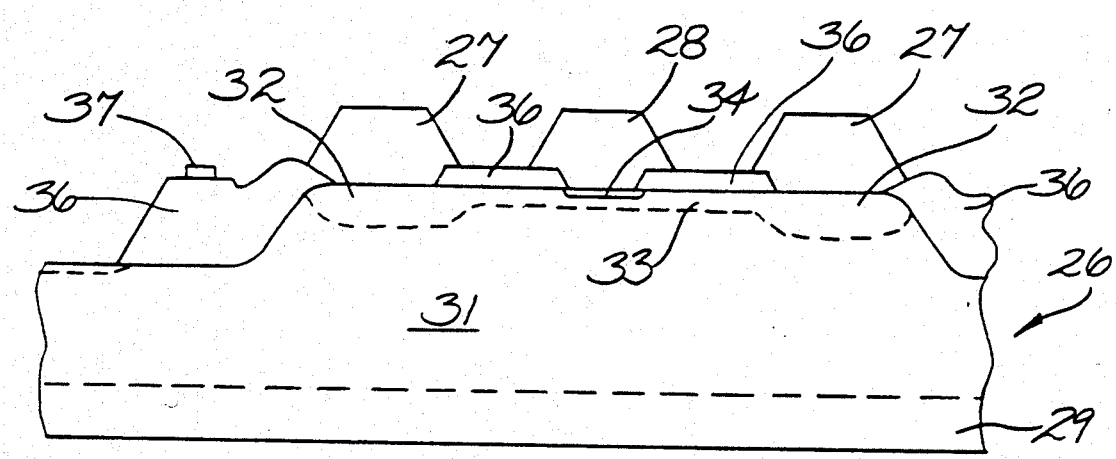
FIG. 2 is a cross section, illustrated schematically, of the solid state bipolar transistors in the monolithic amplifier device.

It is important to understand that in the manufacture of monolithic bipolar devices from a discrete bipolar process, the collectors of each transistor must be connected to each other. This is illustrated with reference to FIG. 2. A typical bipolar transistor is made from a semiconductor wafer 26 wherein the base and emitter electrodes 27 and 28 respectively are formed on one side of the wafer. The wafer has an n-type collector substrate 29 in which a lightly doped n-type epitaxial 31 layer is diffused. Underneath each of the base electrodes, heavily doped p-type inserts 32 are diffused in the epitaxial layer 31. A narrow p-type base implant 33 is also diffused into the surface of the epitaxial layer 31. The base implant 33 covers the entire upper surface of the epitaxial layer in the region between the base electrodes 27 and under the emitter electrode 28. A heavily doped n-type emitter 34 is diffused in the upper surface of the base implant 33 directly under the emitter electrode 28.

Also included in the semiconductor ship are various oxide sections. For example, field oxide sections 36 provide electrical isolation between the semiconductor and other circuit components, such as resistors 37, bond pads (not shown) and metal connections (not shown). Base oxide sections 35 electrically isolate the electrical contacts (i.e. the base, emitter, gate or drain) from portions of the semiconductor. By placing the resistors on the chip itself, a monolithic amplifier can be achieved where no external devices are required to bias the amplifier (except for connection to a supply voltage).

Each transistor formed on the wafer has separate base and emitter regions and accompanying electrodes. However, all of the transistors share a common collector substrate 29.

Figure 3:
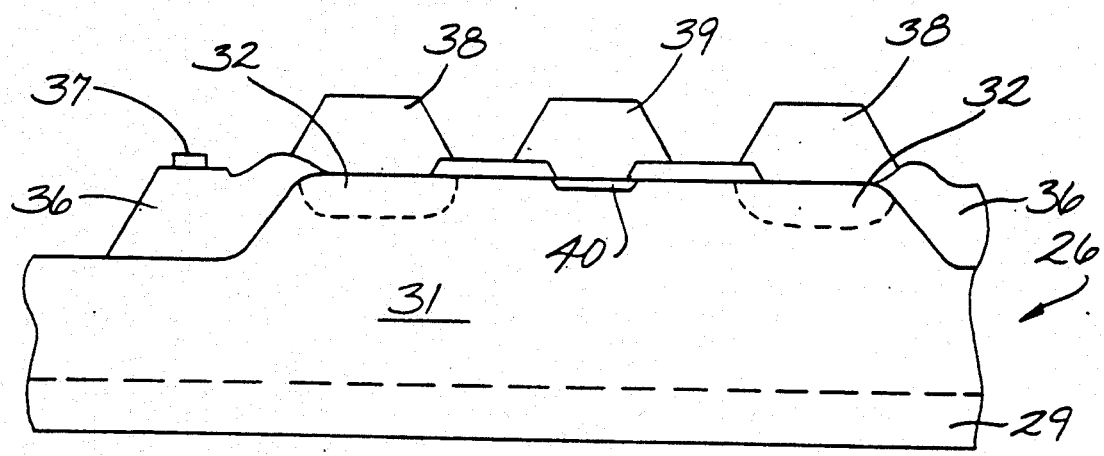
FIG. 3 is a cross section, illustrated schematically, of the solid state field effect transistor in the monolithic amplifier device.

In the present invention, a field effect transistor is formed on the wafer, alongside the bipolar transistors, by slightly modifying the bipolar process. The FET is created by suppressing the base implant step in the bipolar process. Referring to FIG. 3, the FET has an n-type substrate 29 and an n-type epitaxial layer 31. In the FET however, the substrate 29 comprises the source of the FET, in contrast to the collector in the bipolar transistors. Gate and drain electrodes 38 and 39 respectively, are provided on the upper surface of the wafer. A p-type insert 32 is diffused into the epitaxial layer under each of the gate electrodes and a n-type semiconductor layer 40 is diffused in the upper surface of the epitaxial layer directly under the gate electrode. The n-type semiconductor layer 40 is the same as the n-type emitter 34 in the bipolar transistor. The structure of the FET is the same in all respects as the bipolar transistor except for the omission of the p-type implant.

The base implant is suppressed in the formation of selected transistors on the wafer by a suitable photomask alteration of the photomask prevents the base implant from forming on each of the transistors which are to be used as variable resistance elements.

The result is a vertically structured FET wherein the depletion region, controlled by a potential connected to the gate electrodes, emanating from the boundary between the epitaxial layer and the p-type inserts controls the conductivity of the epitaxial layer between the drain electrode and the substrate.

Since the FET is made from the same bipolar process as the bipolar transistors, it is subject to the same layout constraint as the bipolar transistors. Specifically, the source of the FET must be connected to the collectors of the bipolar transistors. Again, this limits the usable circuit configurations.

In an alternate circuit embodiment, the FET may be connected in series between the collectors of the bipolar transistors and the output terminal of the amplifier rather than in the resistive feedback loop. In this embodiment, the shunt feedback loop has a constant resistive value, and thus the actual gain of the amplifier is constant. However, the FET is capable of variably attenuating the output of the amplifier, thus creating an apparent variation in amplifier gain at the output of the device. This circuit can only be used, however, in circuits where the output impedance of the amplifier, or the variation of the output impedance, is not important. Since the FET is connected in series with the output of the amplifier, the output impedance of the amplifier will change in proportion to the impedance of the FET.

In many microwave applications, the input and output impedances of an amplifier must be fixed. For example, transmission lines require that the output and input of any device connected to the line be closely matched. Typically, transmission lines require that the input impedance and output impedance of a electrical device both be 50 or 75 ohms. Unmatched circuits commonly cause ringing and instabilities in transmission lines.

In the presently preferred embodiment of the present invention, the FET is connected in the shunt feedback loop of the amplifier, as shown in FIG. 1. This circuit, in turn, maintains a very close impedance match between its input and output.

The described embodiment of this invention is illustrative and the scope of this invention is not to be restricted to the described embodiments herein. Those skilled in the art to which this invention pertains will appreciate that alterations can be practiced without departing from the principles and scope of this invention.

What is claimed is:

1. A monolithic bipolar variable gain amplifier formed by a discrete bipolar process comprising:
   a first transistor and a second transistor connected together in a Darlington configuration on a single chip and having an input and an output;
   a resistive shunt feedback loop connected between the output and the input to control the gain of the amplifier; and
   means on the same chip as the transistors for actively varying the impedance of the shunt feedback loop thereby varying the gain of the amplifier.

2. A monolithic bipolar variable gain amplifier formed by a discrete bipolar process comprising:
   a fist transistor and a second transistor connected together in a Darlington configuration having an input and an output;
   a resistive shunt feedback loop connected between the output and the input to control the gain of the amplifier; and
   means for varying the impedance of the shunt feedback loop thereby varying the gain of the amplifier comprising a field effect transistor connected in series with the shunt feedback loop.

3. An amplifier as recited in claim 2 comprising means for applying a control voltage to the gate of the field effect transistor for controlling the conductance of the field effect transistor, and thus the gain of the amplifier.

4. A amplifier as recited in claim 2 wherein the field effect transistor is formed by substantially the same discrete bipolar process as the transistor in the Darlington configuration.

5. An amplifier as recited in claim 2 comprising means for dc biasing the field effect transistor for inhibiting the field effect transistor from drawing dc current.

6. An amplifier as recited in claim 5 comprising a first resistor connected between the supply voltage and the source of the field effect transistor and a second resistor connected between the supply voltage and the drain of the field effect transistor, the voltage drop across each of the first and second resistors being substantially equal, for biasing the field effect transistor.

7. A monolithic bipolar variable gain amplifier formed by a discrete bipolar process comprising:
   a first transistor and a second transistor connected together in a Darlington configuration having an input and an output;
   a resistive shunt feedback loop connected between the output and the input to control the gain of the amplifier;
   means for varying the impedance of the shunt feedback loop thereby varying the gain of the amplifier; and
   means for substantially matching the input impedance of the amplifier to the output impedance of the amplifier.

8. A monolithic bipolar variable gain amplifier manufactured by a discrete bipolar process comprising:
   a first bipolar transistor and a second bipolar transistor connected together in a Darlington pair configuration having an input and an output;
   a resistive shunt feedback loop connected between the output and the input to control the gain of the amplifier; and
   means for varying the gain of the amplifier in response to a control voltage, the means for varying the gain being coupled to the output.

9. An amplifier as recited in claim 8 wherein the means for varying the gain of the amplifier comprises a field effect transistor connected in series with the resistive shunt feedback loop, the modulation of the conductance. If the field effect transistor thereby changing the impedance of the feedback loop and the gain of the amplifier.

10. An amplifier as recited in claim 8 wherein the means for varying the gain of the amplifier comprises a field effect transistor, the source of the field effect transistor being connected to the input of the Darlington pair and the drain comprising the output of the amplifier, the modulation of the conductance of the field effect transistor thereby attenuating the output voltage of the Darlington pair.

11. A monolithic variable gain amplifier formed on a single semiconductor chip according to a bipolar process wherein the substrate of the semiconductor chip comprises one of the electrodes of each semiconductor component on the chip, the amplifier comprising:
- a Darlington bipolar transistor pair having independent base and emitter electrodes;
- a variable resistance shunt feedback loop coupled between the substrate and the base of the Darlington pair for controlling the gain of the amplifier;
- biasing means connected to the Darlington pair for establishing the quiescent current for the Darlington pair; and
- control means coupled to the variable resistance shunt feedback loop for stabilizing the quiescent current of the Darlington pair.

12. A monolithic variable gain amplifier as recited in claim 11 wherein the Darlington pair comprises first and second bipolar transistors, the base of the first bipolar transistor being the base of the Darlington pair, the emitter of the first bipolar transistor being connected to the base of the second bipolar transistor, the emitter of the second bipolar transistor being the emitter of the Darlington pair, the substrate of the semiconductor chip comprising the collector of each of the first and second bipolar transistors.

13. A monolithic variable gain amplifier as recited in claim 11 wherein the variable resistance shunt feedback loop comprises a field effect transistor, the substrate of the semiconductor chip comprising the source of the field effect transistor, the conductance of the field effect transistor being proportional to a control voltage connected to its gate electrode.

14. A monolithic variable gain amplifier as recited in claim 13 wherein the variable resistance shunt feedback loop further comprises a fixed feedback resistor connected in series between the drain of the field effect transistor and the base of the Darlington pair.

15. A monolithic variable gain amplifier as recited in claim 14 wherein the biasing means comprises a drop-down resistor connected between a supply voltage and the substrate of the semiconductor chip.

16. A monolithic variable gain amplifier as recited in claim 15 wherein the control means comprises a bias control resistor connected between the drain of the field effect transistor and the supply voltage.

17. A monolithic variable gain amplifier as recited in claim 16 wherein the value of the bias control resistor is selected proportionately to the biasing means for inhibiting the field effect transistor from drawing quiescent current.

18. A monolithic variable gain amplifier as recited in claim 11 wherein the biasing means comprises a drop-down resistor connected between the substrate of the semiconductor chip and a supply voltage.

19. A monolithic bipolar variable gain amplifier as recited in claim 11 wherein the impedance into the base of the Darlington pair is substantially matched to the impedance out of the substrate of the semiconductor chip.

20. A monolithic bipolar variable gain amplifier having an input and output and wherein the gain varies in response to the potential of a control voltage, the amplifier comprising:
- a first non-isolated bipolar transistor having a base, an emitter and a collector, the base being connected to the input and the collector being connected to the output;
- a second non-isolated bipolar transistor having a base, an emitter and a collector, the base being connected to the emitter of the first bipolar transistor, the collector being connected to the collector of the first bipolar transistor and the emitter being connected to ground;
- an emitter resistor connected in series between the emitter of the first bipolar transistor and ground;
- a base resistor connected in series between the base of the first bipolar transistor and ground;
- a non-isolated field effect transistor having a drain, a gate and a source, the source being connected to the collectors of the first and second bipolar transistors and the gate being connected to the control voltage;
- a drop-down resistor connected between the source of the field effect transistor and a supply voltage;
- a first feedback resistor connected between the drain of the field effect transistor and the supply voltage; and
- a second feedback resistor connected between the drain of the field effect transistor and the base of the first bipolar transistor.

* * * * *